United States Patent [19]
Goto

[11] Patent Number: 6,037,189
[45] Date of Patent: *Mar. 14, 2000

[54] INTEGRATED WAVEGUIDE DEVICE AND METHOD OF FABRICATING THE INTEGRATED WAVEGUIDE DEVICE

[75] Inventor: Katsuhiko Goto, Itami, Japan

[73] Assignee: Mitsubishi Denki Kabushiki Kaisha, Tokyo, Japan

[*] Notice: This patent issued on a continued prosecution application filed under 37 CFR 1.53(d), and is subject to the twenty year patent term provisions of 35 U.S.C. 154(a)(2).

[21] Appl. No.: 08/542,538

[22] Filed: Oct. 13, 1995

[30] Foreign Application Priority Data

Oct. 17, 1994 [JP] Japan .................................. 6-250634

[51] Int. Cl.[7] .................................................. H01L 21/20
[52] U.S. Cl. ................................ 438/31; 438/30; 438/32; 438/39; 117/956; 372/43; 372/45
[58] Field of Search ................................ 438/31, 30, 32, 438/39; 117/956; 372/43, 45

[56] References Cited

U.S. PATENT DOCUMENTS

| | | | |
|---|---|---|---|
| 3,900,863 | 8/1975 | Kim | 438/39 |
| 5,313,484 | 5/1994 | Arimoto | 438/39 |
| 5,436,195 | 7/1995 | Kimura et al. | 437/129 |
| 5,522,005 | 5/1996 | Moretti et al. | 438/31 |
| 5,580,818 | 12/1996 | Sakata | 438/39 |
| 5,656,539 | 8/1997 | Motoda et al. | 438/39 |

FOREIGN PATENT DOCUMENTS

| | | |
|---|---|---|
| 0297838 | 1/1989 | European Pat. Off. . |
| 0377281 | 7/1990 | European Pat. Off. . |
| 3485863 | 1/1995 | Germany . |
| 8032175 | of 0000 | Japan . |
| 2124024 | 2/1984 | United Kingdom . |
| 2221094 | 1/1990 | United Kingdom . |
| 9415231 | 7/1994 | WIPO . |

OTHER PUBLICATIONS

Shahar, et al., "Dynamic Etch Mask Technique for Fabricating Tapered Semiconductor Optical Waveguides and Other Structures", Appl. Phys. Lett. vol. 56, No. 12, Mar. 19, 1990.

Brenner et al., "Intergrated Optical Modeshape Adapters in InGaAsP/InP for Efficient Fiber–to–Waveguide Coupling", IEEE Photonics Tech. Letters, vol. 5, No. 9, Sep. 1993.

Yoshikawa et al, "A Self–Aligned Ridge Substrate Laser Fabricated By Single–Step MOVPE", Journal of Crystal Growth, vol. 93, 1988, pp. 843, 847, and 849.

Primary Examiner—Robert Kunemund
Attorney, Agent, or Firm—Leydig, Voit & Mayer, Ltd.

[57] ABSTRACT

A method of fabricating an integrated waveguide device includes forming a ridge having a width that varies in a tapered shape along the [011] direction on a semiconductor substrate and growing a laminated layer structure including a light waveguide layer where the width varies in a tapered shape of the ridge so that a waveguide has a tapered shape in the laminated layer structure, thereby producing an integrated waveguide device having a tapered light waveguide. The thickness of the semiconductor layer and the wavelength guided by the waveguide are controlled with high precision and the reliability of the device is enhanced.

24 Claims, 14 Drawing Sheets cross section along
the waveguide direction mask pattern (plan view)

sectional view along A-A' sectional view along B-B'

INTEGRATED WAVEGUIDE DEVICE AND METHOD OF FABRICATING THE INTEGRATED WAVEGUIDE DEVICE

FIELD OF THE INVENTION

This invention relates to integrated waveguide device and methods for fabricating the integrated waveguide device. Particularly, this invention relates to a waveguide lens, a laser diode with a waveguide lens, a laser diode with a waveguide lens and a modulator, and other integrated optical device, and methods for fabricating them.

BACKGROUND OF THE INVENTION

FIGS. 11(a)–11(b) are schematic diagrams of a laser diode (LD) with a waveguide lens according to a prior art. In the figure, reference numeral 1 designates an n-InP substrate, numeral 3 designates an n-InP cladding layer formed on the n-InP substrate 1, numeral 2 designates a waveguide 0.1 μm thick comprising an InGaAs/InGaAsP multi quantum well layer formed on the n-InP cladding layer 3, and numeral 4 designates a p-InP cladding layer formed on the n-InP cladding layer 3 so as to bury the waveguide 2. The waveguide 2 comprises a portion 2a of laser active layer having a width of about 1 μm in a laser region LD, and comprises a waveguide portion 2b with a tapered width at a waveguide portion (lens portion) L, and the width of the tip is about 0.3 μm. A spot size of the tip of the taper shaped waveguide portion 2b is about several μm.

FIGS. 12(a)–12(b) are schematic diagrams of a laser diode (LD) with a waveguide lens according to another prior art. In these figures, the same reference numerals as in FIGS. 11(a)–11(b) designate the same or corresponding parts. Reference numeral 22 designates a waveguide, numeral 22a designates a laser active layer portion in a laser region LD as in the FIGS. 11, and numeral 22b designates a waveguide portion 22b with a tapered width in a lens portion L. The thickness of the tip of the waveguide portion 22b is about one fifth of that of the waveguide 22a of the LD portion. Here, the LD with a waveguide lens is an LD having an integrated waveguide lens for efficiently transmitting laser beam from the LD to an optical fiber.

Conventionally, a spot size (about 1 μm) of laser beam guiding through a waveguide of an LD is quite smaller than a core size (about 10 μm) of an optical fiber, so that it is difficult to couple directly an optical fiber with an LD, and efficient coupling of light is not feasible. In order to avoid the above-described difficulty, a waveguide lens widens a spot size of laser beam from LD before coupling into an optical fiber. In fact, the waveguide lens is narrowed as the waveguide portion 2b in the vicinity of a laser beam emitting facet FA as shown in FIG. 11(a), or is thinned in a tapered shape as the waveguide portion 22b as shown in FIGS. 12(a)–12(b), so that the optical confinement is reduced, whereby a waveguide lens widens the spot size of laser beam to about 5 μm. However, the LD with a waveguide lens according to a prior art still has difficulties in the fabricating method, which will be described below.

Initially, in order to obtain a sufficient spot size with using the structure of FIG. 11(a), the narrowest portion of the waveguide 2 is required to be about 0.3 μm However, performing a high-accuracy photolithograpy and etching in this size are very difficult with using the LSI technique or the like.

On the other hand, there are two methods for fabricating the structure of FIGS. 12 as follows, <1> The LD portion is made to be thicker than the lens portion using layer thickness increasing effect by selective growth of a semiconductor layer using a mask.

<2> The waveguide at a lens portion is made to be a taper shape and to be more thin than that of LD using a specific etching.

Where the thickness of the tip of the lens portion of the waveguide is about one fifth of that of the LD portion as described above.

A description is given of the method <1>.

FIG. 13(a) shows a selective growth mask pattern for a crystal growth of a semiconductor layer by MOCVD, and FIG. 13(b) shows a profile of the thickness along c–c' of the semiconductor layer grown using the mask. In the region where the laser active layer sandwiched by the selective growth masks 31 of LD portion LD is formed, excessive raw material species are supplied from the surface of mask 31 by vapor phase diffusion, so that the growth rate is increased and the layer becomes thick as compared with that in the region which has no mask. Since the quantity of the vapor phase diffusion is varied dependent on raw material species, a composition of the growing layer is varied in the region sandwiched by the masks as compared with the region of the lens portion L which has no mask.

In the case where InGaAsP is grown, InGaAsP having a large composition ratio of In is grown in the region sandwiched by the masks of the LD portion LD because the quantity of the vapor phase diffusion of In is larger than that of Ga, where In and Ga are device of III group. The lattice constant of InGaAsP is large in proportion as a quantity of In is large in the ratio of In and Ga, so that a difference in the lattice constant between the growing crystal and the substrate is large, whereby crystal defects occur, as a result, the quality of the crystal is deteriorated.

As another problem of this method <1>, because there is five times difference between the thick part and the thin part of the growing layer on the substrate (it is required to provide such difference as described above), a difference in level is occurred at the boundary portion between the two parts, and this difference in level may be an obstacle in the subsequent process of producing device.

In the above-described method <1>, it is necessary to make the thickness of the LD portion five times as thick as the other portion. Assuming that InGaAs/InGaAsP multi quantum well waveguide layer is grown, the composition is varied (the ratio of In to Ga, and the ratio of As to P are varied) in the selective growth region sandwiched by the masks, and it is difficult to suppress the thickness of the LD portion with accuracy. As a result, difficulties in the quality of the crystal and suppressing the wavelength with accuracy or the like are occurred by lattice strain due to the change of composition.

On the other hand, two methods are given as the method <2> in following subsections.

As the one method, as shown in FIG. 14(a), initially, a waveguide 22 is formed by alternately laminating InGaAaP layers 19a~19e and the InP etching stopper layers 14a~14e. Next, an etching mask 20 is formed at the required position on the uppermost surface layer 19a, and using this mask, the InGaAsP layer 19a is etched by etchant, i.e., nitric acid or the like, until the etching is stopped by an InP etching stopper-layer. Thereafter, the exposed portion of the InP etching stopper layer 14a beyond the InPGaAsP layer 19a is etched by etchant which etches InP and does not etch InGaAsP, i.e., hydrochloric acid, whereby the two upper layers shown in FIG. 14(b) are formed. Respective layers 19b, 14b, 19c, 14c, 19d, 14d, 19e, and 14e are formed in the above-described process, resulting in the structure of FIG. 14(b).

As the other method, as shown in FIG. 15(a), an oxide film 15 having a tapered portion is formed on the waveguide 22, and as shown in FIG. 15(b), the waveguide 22 is etched by ion milling 15b through the oxide film 15, whereby a tapered waveguide portion 22b having a tapered thickness is formed. However, these methods have particular and complicated processes, and the surface of the waveguide layer is directly etched and regrowth of crystal is performed thereon. Therefore, there is a fear of deteriorating the reliability of the device.

SUMMARY OF THE INVENTION

It is an object of the present invention to provide a method for fabricating integrated waveguide device that precisely control a layer thickness during growing a semiconductor layer and prevent deterioration of the quantity of crystal caused by lattice strain and control wavelengths with accuracy.

It is another object of the present invention to provide a method for fabricating integrated waveguide device that prevent the device from difficulties as described above.

It is still another object of the present invention to provide a method for fabricating a waveguide lens, an LD with a waveguide lens, an LD with a waveguide lens and a modulator, and an optical integrated device with a waveguide lens which are fabricated by the above-described fabricating method of the integrated waveguide device.

Other objects and advantages of the present invention will become apparent from the detailed description given hereinafter; it should be understood, however, that the detailed description and specific embodiment are given by way of illustration only, since various changes and modifications within the scope of the invention will become apparent to those skilled in the art from this detailed description.

According to a first aspect of the present invention, a fabricating method of an integrated waveguide device comprises, forming a ridge having a portion whose width varies in a tapered shape along the [011] direction on a semiconductor substrate, and growing a layer laminating structure including a light waveguide layer on the portion having a width varying in a tapered shape of the ridge, thereby fabricating an integrated waveguide device having a taper shaped light waveguide whose width varies in a taper shape and which constitute a waveguide lens. Therefore, the thickness of the semiconductor layer and the wavelength of the light guided by the waveguide are controlled with high precision, and the reliability of the device is enhanced.

According to a second aspect of the present invention, an integrated waveguide device is fabricated by the above-described method. Therefore, an integrated waveguide device in which the thickness of the semiconductor layer and the wavelength of the light guided by the waveguide are controlled with high precision and which has enhanced reliability is fabricated.

According to a third aspect of the present invention, the integrated waveguide device is a waveguide lens.

According to a fourth aspect of the present invention, the integrated waveguide device is a laser diode with a waveguide lens.

According to a fifth aspect of the present invention, the integrated waveguide device is an optical integrated device with a waveguide lens.

According to a sixth aspect of the present invention, a fabricating method of an integrated waveguide device comprises, forming a ridge having a width varying in a tapered shape along the [011] direction on a semiconductor substrate, growing a layer laminating structure including a light waveguide layer on the portion having a width varying in a tapered shape of the ridge, such that the layer having a triangular cross-section is grown on the part narrowing in a tapered shape of the ridge and the waveguide layer is formed at the apex of the triangle, thereby producing a taper shaped light waveguide whose width and thickness vary in a tapered shape and which constitutes a waveguide lens. Therefore, an integrated waveguide device in which the thickness of the semiconductor layer and the wavelength of the light guided by the waveguide are controlled with high precision and which has enhanced reliability is fabricated.

According to a seventh aspect of the present invention, an integrated waveguide device is fabricated by the above-described method. Therefore, an integrated waveguide in which the thickness of the semiconductor layer and the wavelength of the light guided by the waveguide are controlled with high precision and which has enhanced reliability is obtained.

According to an eighth aspect of the present invention, in the above-described integrated waveguide device, the integrated waveguide device is a laser diode with a waveguide lens.

According to a ninth aspect of the present invention, a fabricating method of an integrated waveguide device comprises, forming a selective growth mask which is formed in a stripe shaped along the [011] direction on the semiconductor substrate and has a portion that a width of the aperture varies in a tapered shape, and performing a crystal growth on the semiconductor substrate having the growth mask, such that a layer laminating structure including a waveguide layer is grown at an aperture region of the selective growth mask on the substrate and a taper shaped light waveguide whose width varies in a tapered shape is formed in the layer laminating structure, thereby producing a taper shaped light waveguide whose width varies in a tapered shape and which constitutes a waveguide lens. Therefore, an integrated waveguide device in which the thickness of the semiconductor layer and the wavelength of the light guided by the waveguide are controlled with high precision and which has enhanced reliability is fabricated.

According to a tenth aspect of the present invention, an integrated waveguide device is fabricated by the above-described method. Therefore, a thickness of the semiconductor layer and a wavelength are controlled with accuracy, and the integrated waveguide device which enhance a reliability of the device is obtained.

According to an eleventh aspect of the present invention, in the above-described integrated waveguide device, the integrated waveguide device is a waveguide lens.

According to a twelfth aspect of the present invention, in the above-described integrated waveguide device, the integrated waveguide device is a laser diode with a waveguide lens.

According to a thirteenth aspect of the present invention, in the above-described integrated waveguide device, the integrated waveguide device is an optical integrated device with a waveguide lens.

According to a fourteenth aspect of the present invention, a fabricating method of an integrated waveguide device comprises, forming a selective growth mask which is formed in a stripe shaped along the [011] direction on the semiconductor substrate and which has a portion that a width of the aperture varies in a tapered shape, and performing a crystal growth on the semiconductor substrate having the selective growth mask, such that a layer laminating structure including a waveguide layer is grown on the aperture region of the selective growth mask, and the layer having a triangular cross-section is grown at the part which the width of the ridge narrows in a tapered shape, and the waveguide layer is formed at the apex of the triangle, thereby producing a taper shaped light waveguide whose width and thickness varies in tapered shape. Therefore, an integrated waveguide device in which the thickness of the semiconductor layer and the wavelength of the light guided by the waveguide are controlled with high precision which has enhanced reliability is fabricated.

According to a fifteenth aspect of the present invention, an integrated waveguide device is fabricated by the above-described method. Therefore, an integrated waveguide device in which the thickness of the semiconductor layer and the wavelength of the light guided by the waveguide are controlled with high precision which has enhanced reliability is obtained.

According to a sixteenth aspect of the present invention, in the above-described integrated device, the integrated waveguide device is a laser diode with a waveguide lens.

According to a seventeenth aspect of the present invention, a fabricating method of an integrated waveguide device comprises, forming a region comprising a material or having a surface state which makes it easy for crystal to adhere or to grow a crystal layer as compared with the substrate surface on the semiconductor substrate, and performing a crystal growth on the region, and forming a semiconductor layer including a waveguide layer whose thickness is controlled on the substrate surface, such that a thickness of the layer on the region sandwiched by the regions is relatively thin. Therefore, an integrated waveguide device in which the thickness of the semiconductor layer and the wavelength of the light guided by the waveguide are controlled with high precision and which has enhanced reliability is fabricated.

According to an eighteenth aspect of the present invention, an integrated waveguide device is fabricated by the above-described method. Therefore, an integrated waveguide device in which the thickness of the semiconductor layer and the wavelength of the light guided by the waveguide are controlled with high precision and which has enhanced reliability is obtained.

According to a nineteenth aspect of the present invention, a fabricating method of an integrated waveguide device comprises, forming opposing thickness control regions having several stripe shaped semiconductor layers having a triangular cross-section with side surfaces of the (111)B facet, respectively, along the [011] direction on the semiconductor substrate, and performing a crystal growth on the semiconductor substrate and growing a semiconductor layer laminating structure including a light waveguide layer whose layer thickness is controlled such that the layer having a determined composition in the region sandwiched by the thickness control regions becomes thicker than that at the other region. Therefore, an integrated waveguide device in which the thickness of the semiconductor layer and the wavelength of the light guided by the waveguide are controlled with high precision and which has enhanced reliability is fabricated.

According to a twentieth aspect of the present invention, an integrated waveguide device is fabricated by the above-described method. Therefore, an integrated waveguide device in which the thickness of the semiconductor layer and the wavelength of the light guided by the waveguide are controlled with high precision and which has enhanced reliability is fabricated.

DETAILED DESCRIPTION OF THE PREFERRED EMBODIMENTS

Embodiment 1

Figure 1:
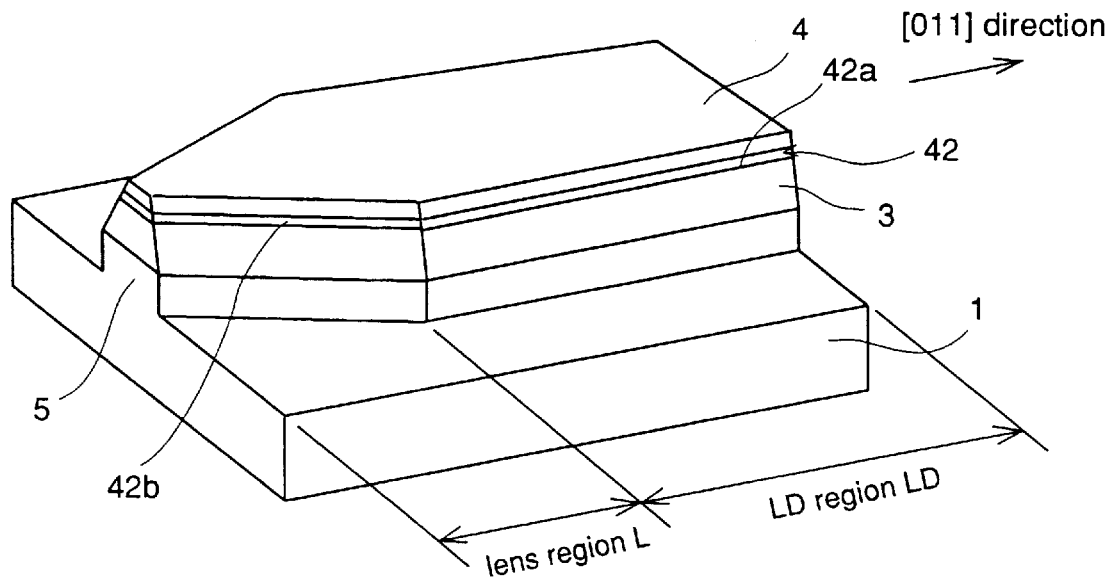
FIG. 1 is a schematic view illustrating a fabricating method of an LD with a waveguide lens having a width varying in a tapered shape at a lens portion according to a first embodiment of the present invention.
Figure 16:
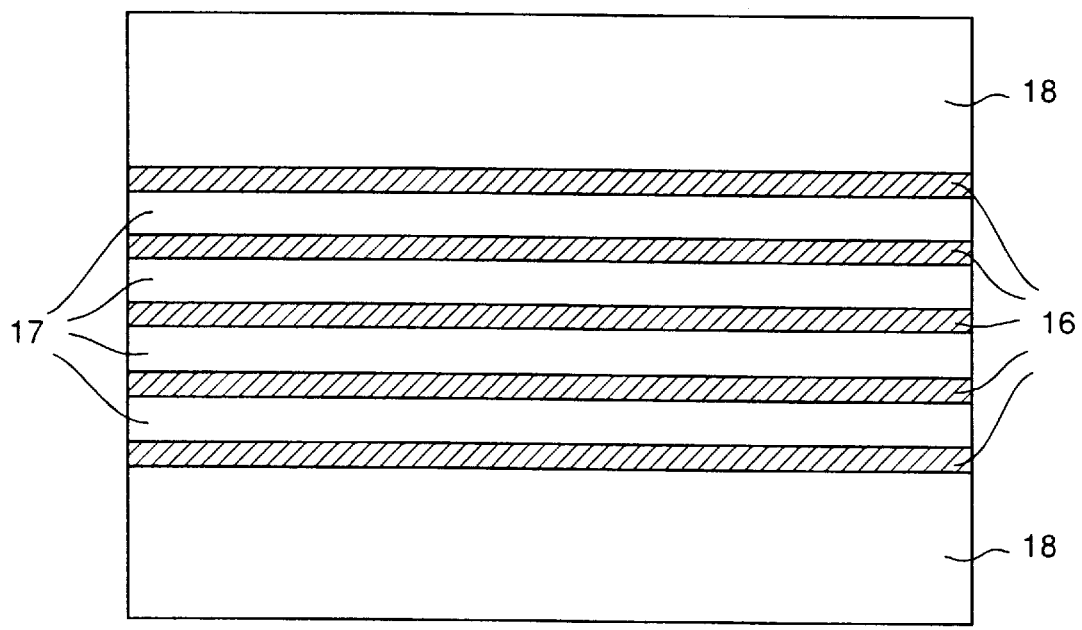
FIG. 16 is a cross-sectional view illustrating an example of a structure of InGaAs/InGaAsP quantum well layer in the present invention.

FIG. 1 is a schematic diagram illustrating a method for fabricating an LD with a waveguide lens which is one of the integrated waveguide device according to a first embodiment of the present invention. In this first embodiment, an LD with a waveguide lens comprising a ridge type burying structure is fabricated. In the figure, reference numeral 1 designates an n-InP substrate, numeral 5 designates a ridge formed at the center of the n-InP substrate, numeral 3 designates an n-InP cladding layer grown on the ridge 5, and numeral 42 designates an InGaAs/InGaAsP multi quantum well layer which serves as an active layer and a waveguide layer of the LD, for example, which have a band gap energy for oscillation of 1.3 μm wavelength laser and a composition that lattice-matches with InP. The LD region LD 42a serves as a laser active layer, the tapered lens region L 42b serves as a waveguide layer. In addition, for example, as shown in FIG. 16, the InGaAs/InGaAsP multi quantum well layer 42 is constituted by InGaAs well layers 16 5 nm thick and InGaAsP barrier layers 17 10 nm thick which are alternatively laminated and optical confinement layers 18 50 nm thick sandwiching those. Numeral 4 designates a p-InP cladding layer formed on the InGaAs/InGaAsP multi quantum layer 42.

A description is given of a fabricating method of the LD with a waveguide lens according to the first embodiment.

A strip shaped ridge 5 along the [011] direction is formed on a surface of n-InP substrate 1 having a (100) surface by photolithography and etching. The width of the ridge 5 is 4 μm in the LD region LD and 0.8 μm at an emitting facet in the lens region L, and the width is varied in a tapered shape in the lens region L.

Figure 2:
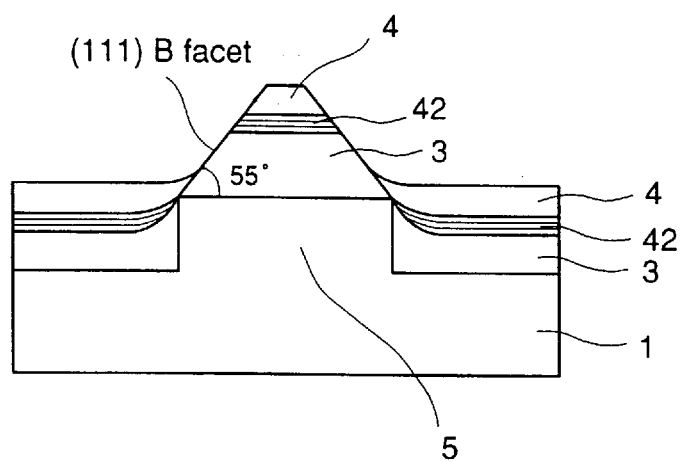
FIG. 2 is a cross-sectional view illustrating a fabricating method of an LD with a waveguide lens having a width varying in a tapered shape at a lens portion according to a first embodiment of the present invention shown in FIG. 1.

Respective semiconductor layers 3, 42, and 4 are grown on the substrate 1 by MOCVD (Metal Organic Chemical Vapor Deposition). Then, respective semiconductor layers 3, 42, 4 are grown on the ridge 5 to configurations having (111) B facet as side surfaces while the growth proceeds. When observed in a cross-section perpendicular to the stripe of the ridge 5, the (111)B facet makes an angle of about 55° with the substrate surface as shown in FIG. 2. When the n-InP cladding layer 3 has about 2 μm thickness, the width of the waveguide layer 42 can be made considerably narrower than that of the ridge 5 because the waveguide layer 42 is grown on the upper edge of the cross-section trapezoidal shape of the n-InP cladding layer 3. For example, the waveguide layer 42 having a width of 1.5 μm on the ridge having a width of 4 μm in the LD region LD, and the waveguide layer 42 having a width of 0.3 μm on the ridge having a width of 0.8 μm at the tip of the tapered lens region L are formed, respectively.

Figure 3:
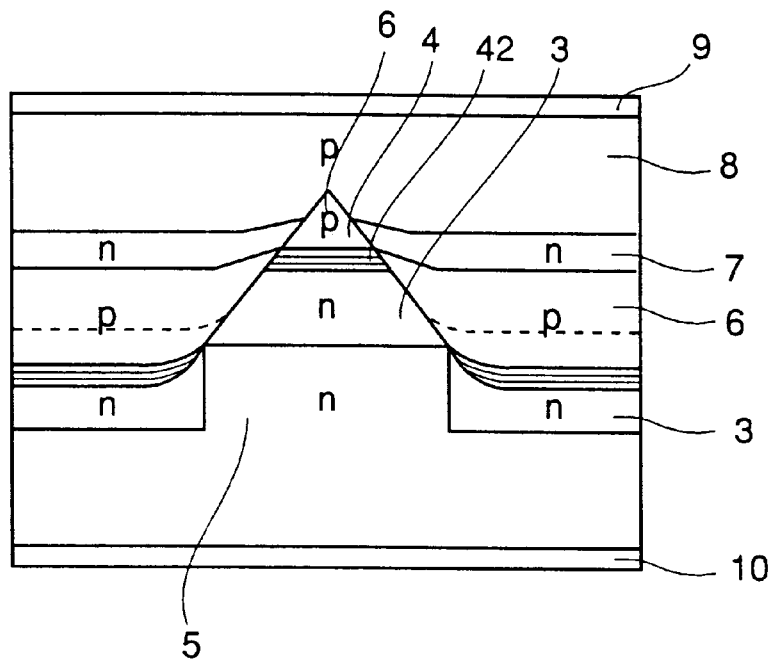
FIG. 3 is a cross-sectional view illustrating a example of a structure of burying the LD with a waveguide lens according to the first embodiment of the present invention.
Figure 11:
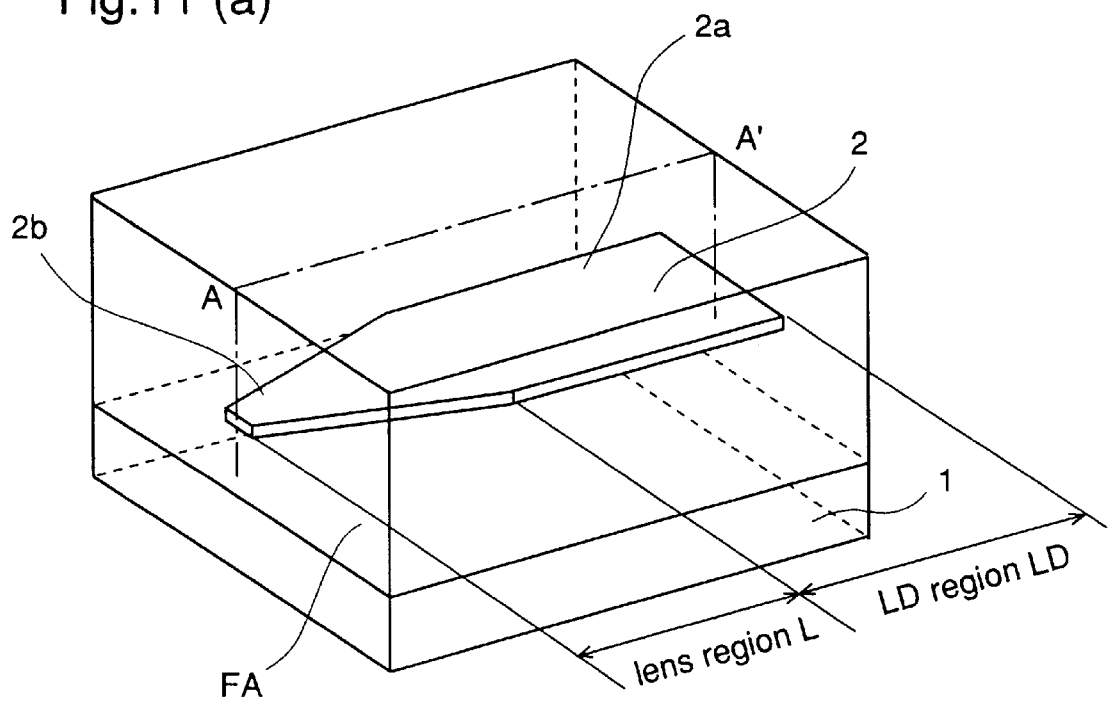
FIGS. 11(a)–11(b) are structural schematic views illustrating an LD with a waveguide lens having a width varying in a tapered shape according to a prior art.
Figure 11:
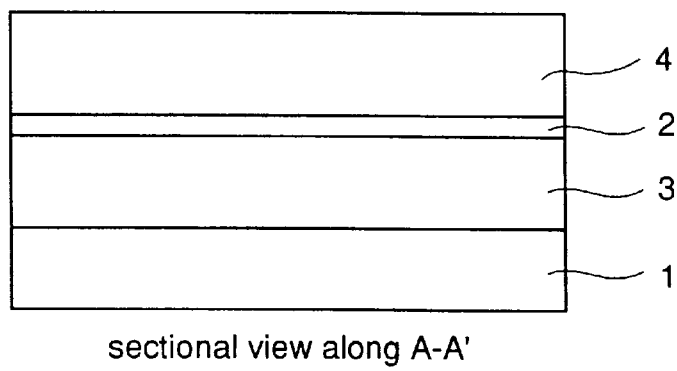

Thereafter, the p-InP cladding layer 4 is formed so as to bury the waveguide layer 42, resulting in the similar structure to the waveguide layer 2 of the device in FIG. 11(a). We have various methods for burying the layer 42, and anymethod can be applied. For example, the semiconductor layers 3, 42, and 4 are also grown outside the ridge, which is not shown in FIG. 2 to make it clear but is shown in FIG. 3.

Then a p-InP layer 6 is further grown until a perfect triangle region is formed on the cross-section trapezoidal portion comprising the semiconductor layers 3, 42, 4 on the ridge 5. After completing the triangular region comprising the semiconductor layers 3, 42, 4, and 6, the subsequent growth proceeds only on the region outside the ridge 5 as shown in FIG. 3.

Accordingly, the triangular region comprising the semiconductor layers 3, 42, 4, and 6 is buried by successive growth of an n-InP current blocking layer 7 and a p-InP layer 8. The burying structure shown in FIG. 1 is completed by single-step MOCVD process. In the burying structure shown in FIG. 1, the current from a p side electrode 9 and an n side electrode 10 is intensively flown to the layer 42 which serves as an active layer of LD due to the pnp current blocking structure comprising the layers 8, 7, and 6, whereby the current contributes to the laser oscillation effectively as conventional BH (Buried Heterostructure).

Figure 4:
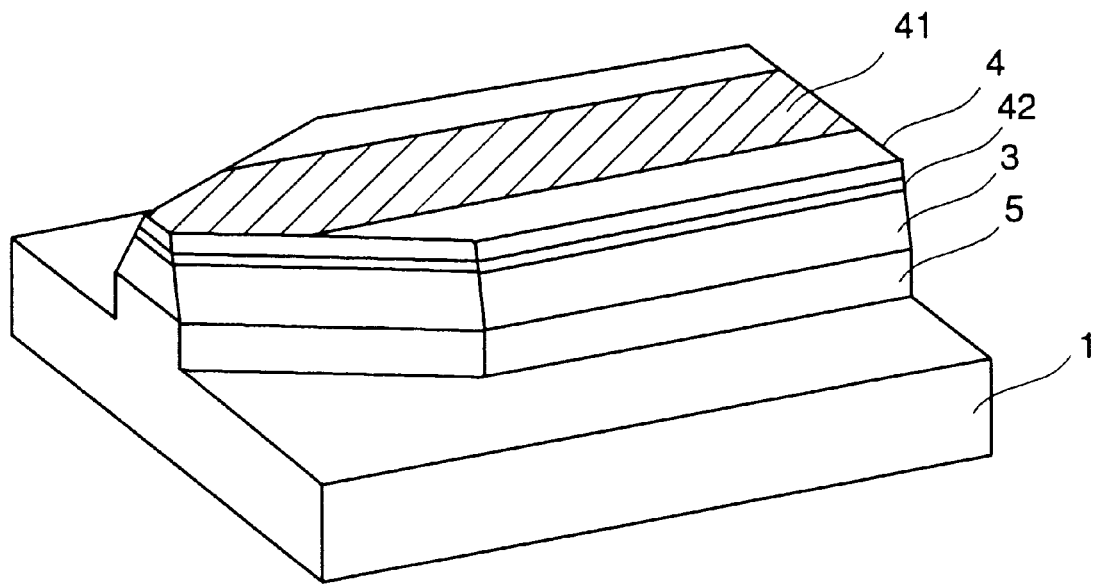
FIG. 4 is a schematic view illustrating another example of a producing a structure of burying the LD with a waveguide lens according to the first embodiment of the present invention.

Other methods of producing the burying structure can be used. For example, as shown in FIG. 4, a mask 41 is formed on the upper surface of cross-section trapezoid shaped portion comprising the semiconductor layers 3, 42, and 4 on the ridge 5, and the above-described respective semiconductor layers and further a part of the ridge 5 of the semiconductor substrate 1 are etched using the mask. Thereafter the selective burying growth of the current blocking layers comprising the semiconductor layers 6, 7, and 8 is performed, whereby the BH is produced using the conventional method.

In the LD with a waveguide lens in accordance with this first embodiment, when the semiconductor layers are grown on the ridge along the [011] direction, by forming the ridge whose width is about 0.8 μm, the waveguide having the very narrow tapered tip with the width of about 0.3 μm is fabricated. Forming the ridge with the width of 0.8 μm is quite easier than that of 0.3 μm, and the waveguide width is controlled with accuracy due to the width and the surface of the crystal growth of the ridge 5. Hence, controllability and precision of the waveguide width are enhanced, whereby an LD with a waveguide lens with high accuracy and high reliability is obtained.

Embodiment 2

Figure 5:
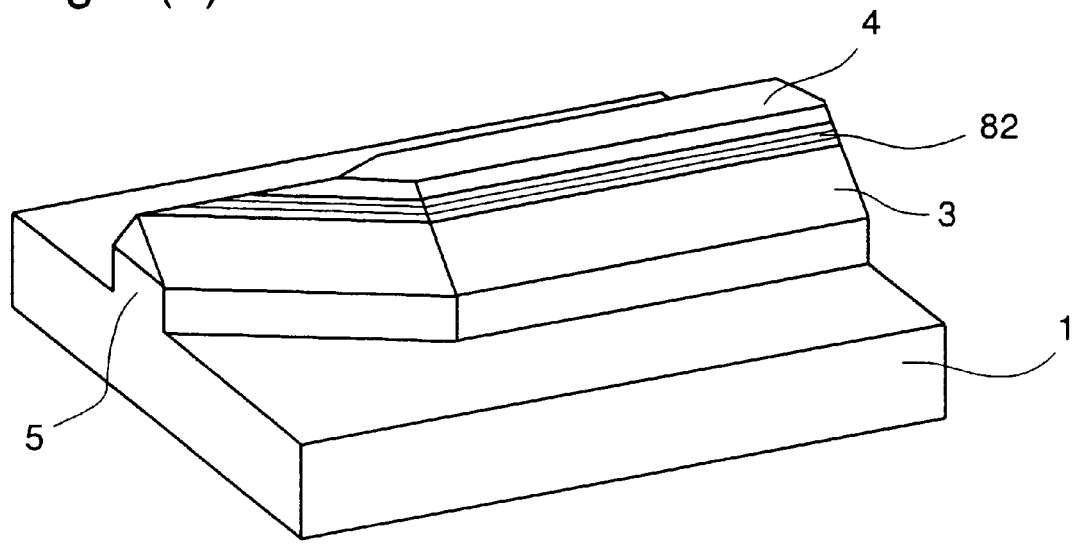
FIGS. 5(a)–5(b) are schematic views illustrating an LD with a waveguide lens having a width and a thickness varying in a tapered shape at a lens portion according to a second embodiment of the present invention.
Figure 5:
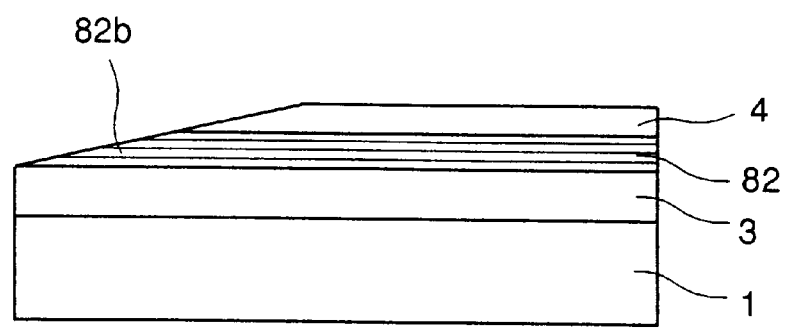
Figure 12:
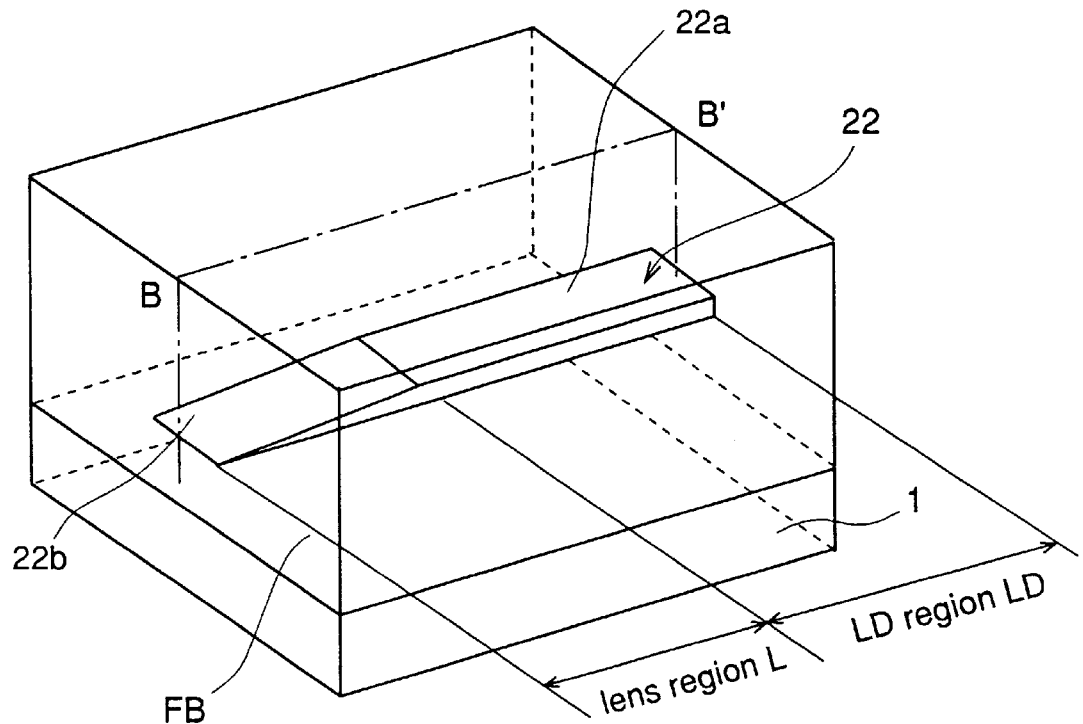
FIGS. 12(a)–12(b) are structural schematic views illustrating an LD with a waveguide lens having a thickness varying in a tapered shape according to a prior art.
Figure 12:
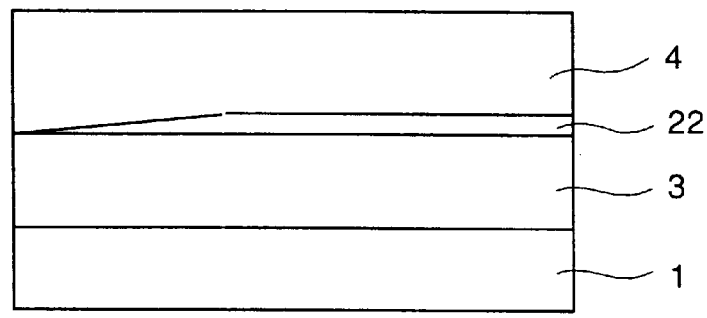

FIG. 5(a) is a schematic diagram explaining a fabricating method of an LD with a waveguide lens in accordance with a second embodiment of the present invention, and FIG. 5(b) is a sectional view of FIG. 5(a) along the waveguide direction. Though the second embodiment is also based on the principle of the first embodiment, it rather corresponds to a combination type of the prior arts shown in FIG. 11 and FIG. 12, i.e., the thickness of the waveguide of the lens portion is tapered as well as the width is tapered.

In FIGS. 5(a)–5(b), the same reference numerals as in FIGS. 1(a)–1(b) designate the same or corresponding parts, reference numeral 82 designates a waveguide comprising an InGaAs/InGaAsP multi quantum well layer, and a waveguide portion 82b at the lens portion of the waveguide is made to have tapered width and thickness.

As shown in the FIG. 5(a), the crystal growth on the ridge 5 proceeds until its cross-section becomes a perfect triangle region with sidefaces having an angle of about 55° with respect to the substrate surface. The triangle is higher as the ridge width is widely. When the waveguide is formed in the vicinity of the apex of the triangle utilizing this property, the waveguide width is narrowed at the narrow portion of the ridge, and the waveguide is formed gradually thin in proportion as the ridge is narrowed because the crystal growth on the ridge does not proceed further when the formation of a perfect triangle is completed. FIG. 5(b) is a sectional view illustrating the center of the ridge along the waveguide direction. In the figure, same reference numerals as in FIG. 2 designate the same or corresponding parts.

In the lens portion LD, the waveguide 82 has a tapered width and a tapered thickness, whereby the spot size of the light propagating on the waveguide 82 is effectively widened and the optical coupling efficiency into the optical fiber is largely increased.

Besides, when the thickness of the waveguide is made to a tapered shape using the above-described method <1> of the prior art, the change of the composition ratio occurs in the selective growth region sandwiched by the masks whereby the lattice strain is generated, so that the deterioration of the quality of the crystal occurs, however in this method, these change of the composition ratio and deterioration of the quality of the crystal do not occur, whereby the problem in which control of the wavelength is difficult does not occur.

In the above-described method <2> of the prior art, the tip of the waveguide is formed in a steps by repeatedly etching so that the waveguide is made to a tapered shape and the oxide film is formed with tapered thickness on the semiconductor layer and the semiconductor having a tapered thickness is formed by ion milling through the oxide film, there is a problem in which the particular and complicated process are required and the surface of the waveguide layer is directly etched and regrowth of crystal is performed thereon so that reliability of the device may be deteriorated, however in this embodiment, the complicated etching process and the regrowth are not required whereby the deteriorating the reliability of the device may not occur.

Thus in the LD with a waveguide lens according to this second embodiment, a waveguide is formed in the vicinity of the apex of the triangle utilizing the property of the crystal growth in which a cross-section triangle is formed on the ridge 5, whereby the waveguide width is tapered and the layer thickness is formed gradually thin in proportion as the ridge narrows. Therefore, the waveguide is formed with high controllability and accuracy, so that the optical spot size is widened effectively and the optical coupling efficiency is increased.

Embodiment 3

Figure 6:
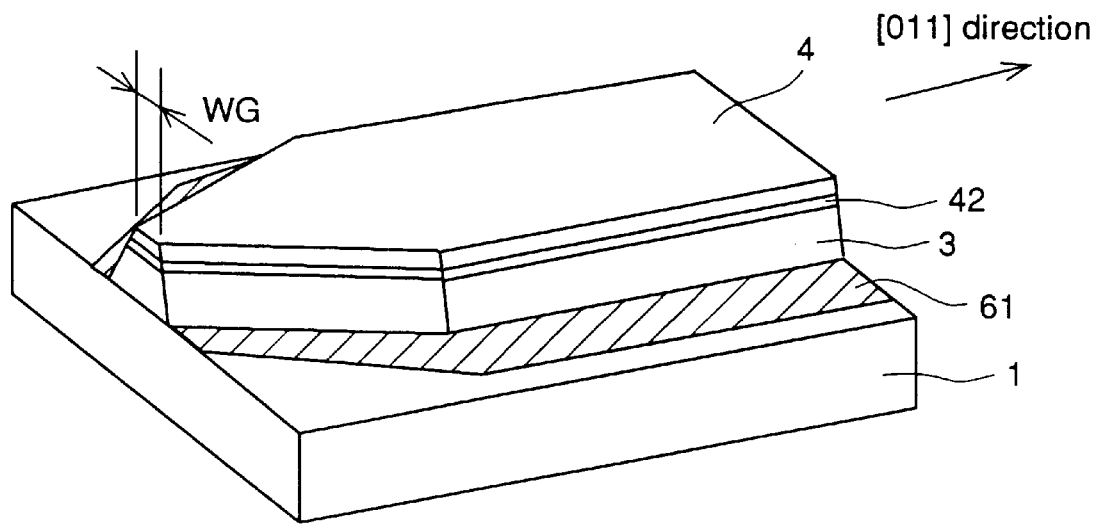
FIGS. 6(a)–6(b) are schematic views illustrating a fabricating method of an LD with a waveguide lens having a width varying in a tapered shape at a lens portion according to a third embodiment of the present invention.
Figure 6:
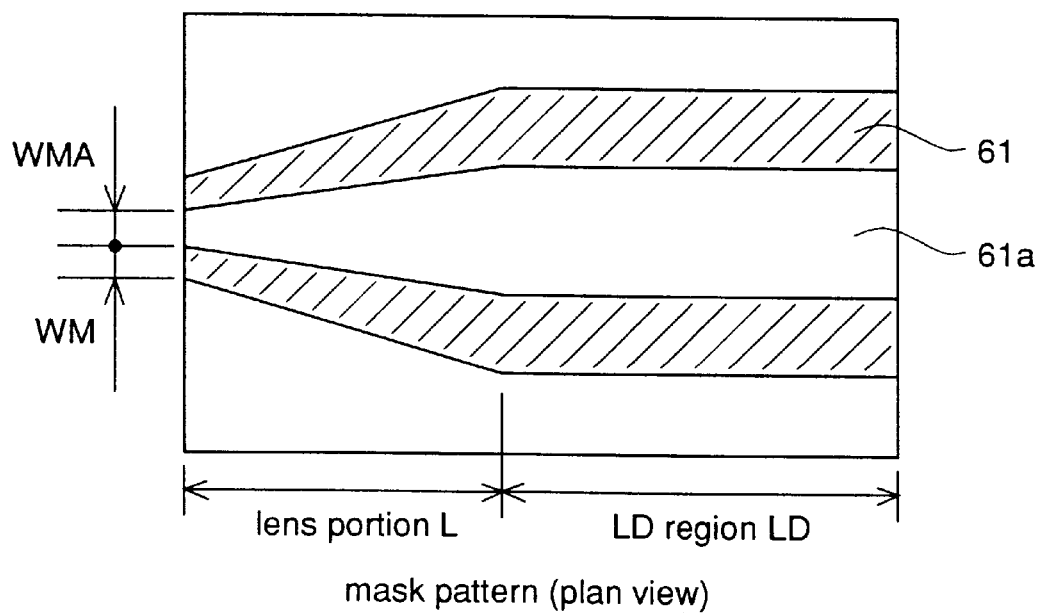

FIG. 6(*a*) is a schematic diagram illustrating a fabricating method of an LD with a waveguide lens according to a third embodiment, and FIG. 6(*b*) is a plan view illustrating a pattern of the selective growth mask used in the method. In this third embodiment, as shown in FIGS. 6(*a*)–6(*b*), stripe shaped masks 61 with narrowed aperture at the lens portion L are formed along the [011] direction on the substrate 1, and the required semiconductor layers 3, 42, and 4 are formed by selective growth using the masks, not according to the first embodiment in which the ridge 5 is formed on the substrate 1 and the semiconductor layers 3, 42, and 4 are grown thereon. On the aperture 61*a* sandwiched by the masks 61, a crystal growth as in the above-described first embodiment is performed and a width WG of a waveguide is controlled simply and accurately by changing the mask aperture width WMA and the mask width WM.

In the case where a selective growth is performed using the masks 61, the growth rate increases in proportion as the width WMA of a mask aperture is narrowed and the mask width WM is widened. In other words, it is required that the mask width WM is narrowed toward the tip of the lens so that the growth rate at the lens portion L and at the LD portion coincide with each other.

In the fabricating method of an LD with a waveguide lens according to the third embodiment, a selective growth is performed using a stripe shaped mask 61 formed along the [011] direction which has a narrowing aperture width at the lens portion L, and the required semiconductor layers forming a waveguide portion are formed, whereby the waveguide having a very narrow tapered tip with the width of 0.3 μm is fabricated with high controllability and accuracy.

Embodiment 4

Figure 7:
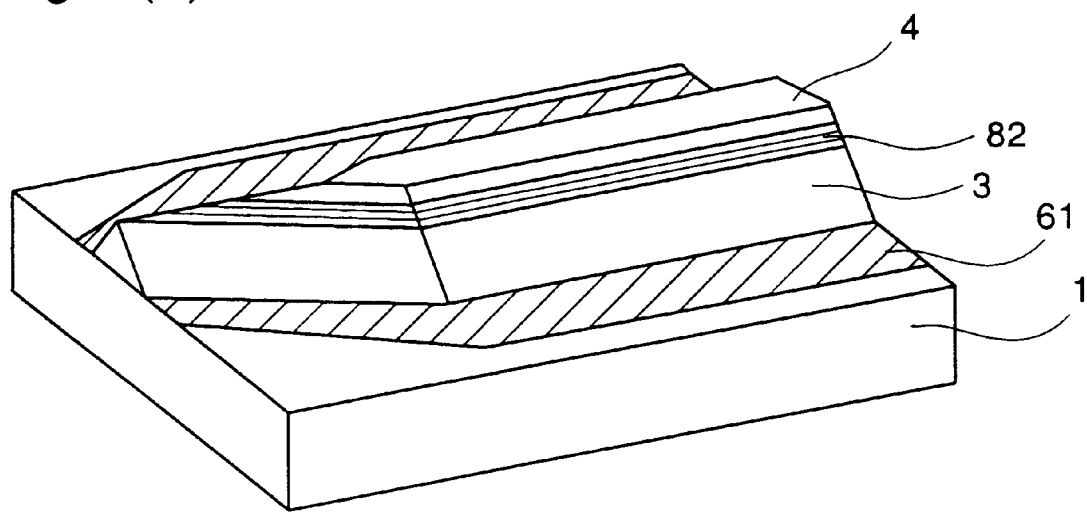
FIGS. 7(a)–7(b) are schematic views illustrating a fabricating method of an LD with a waveguide lens having a width and a thickness varying in a tapered shape at the lens portion according to a fourth embodiment of the present invention.
Figure 7:
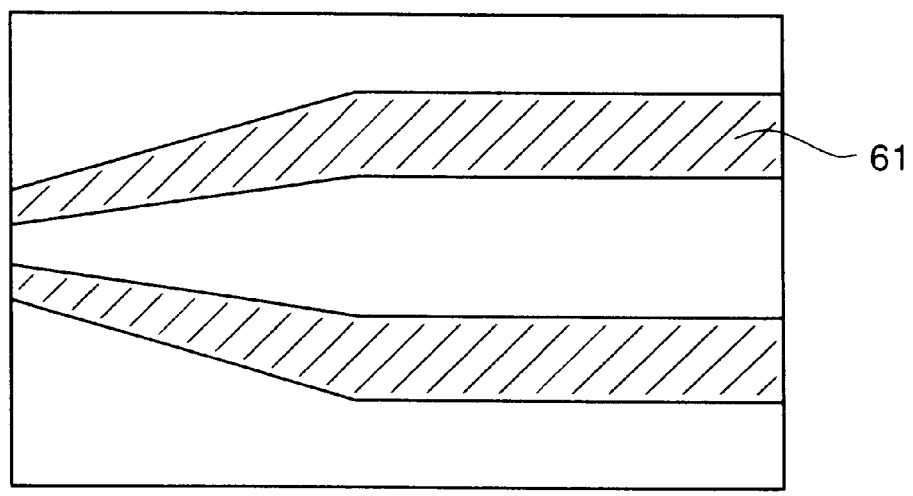

FIG. 7(*a*) is a schematic diagram illustrating a fabricating method of an LD with a waveguide lens according to a fourth embodiment of the present invention, and FIG. 7(*b*) is a plan view illustrating a pattern of a selective mask used in the method. Though this fourth embodiment is also based on the principle of the first embodiment, the thickness of the waveguide of the lens portion is tapered as well as the width is tapered. Therefore, this fourth embodiment corresponds to a combination type of the prior arts shown in FIG. 11 and FIG. 12.

The crystal growth on the mask aperture proceeds until its cross-section becomes a perfect triangle with the sidefaces having an angle about 55° with respect to the substrate surface as shown in FIG. 7(*a*). The triangle is higher as the mask aperture width is wider. A waveguide is formed in the vicinity of the apex of the triangle utilizing this property, whereby the width of the waveguide is narrowed at the narrow portion of the mask aperture and the growth on the mask aperture does not proceed further when the formation of the triangle is completed. Therefore, the layer thickness is gradually thin as the mask aperture is narrowed.

In the fabricating method of an LD with a waveguide lens according to the fourth embodiment, the semiconductor layers forming the waveguide are simply formed, and controllability and precision of the waveguide width are largely enhanced. In addition, since both the waveguide width and thickness are tapered, the spot size is widened effectively and the optical coupling efficiency into the optical fiber is largely increased.

While an LD with a waveguide lens is described in the first to the fourth embodiments, a simple waveguide lens can be constituted, and an optical integrated device integrating an optical amplifier and a modulator or the like via a waveguide can also be constituted.

Embodiment 5

Figure 8:
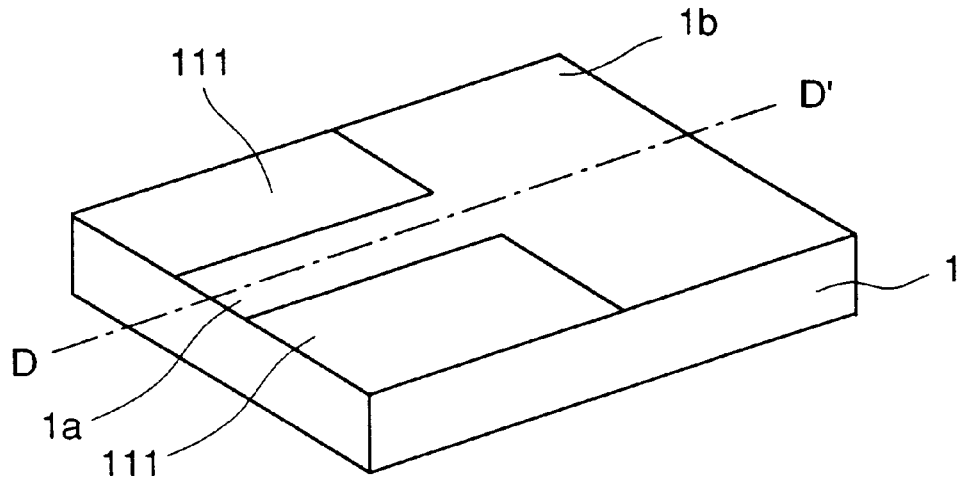
FIG. 8(a) is a schematic view illustrating a fabricating method of an LD with a waveguide lens having a width varying in a tapered shape at the lens portion and 8(b) is a profile showing a layer thickness using a selective growth according to a fifth embodiment of the present invention.
Figure 8:
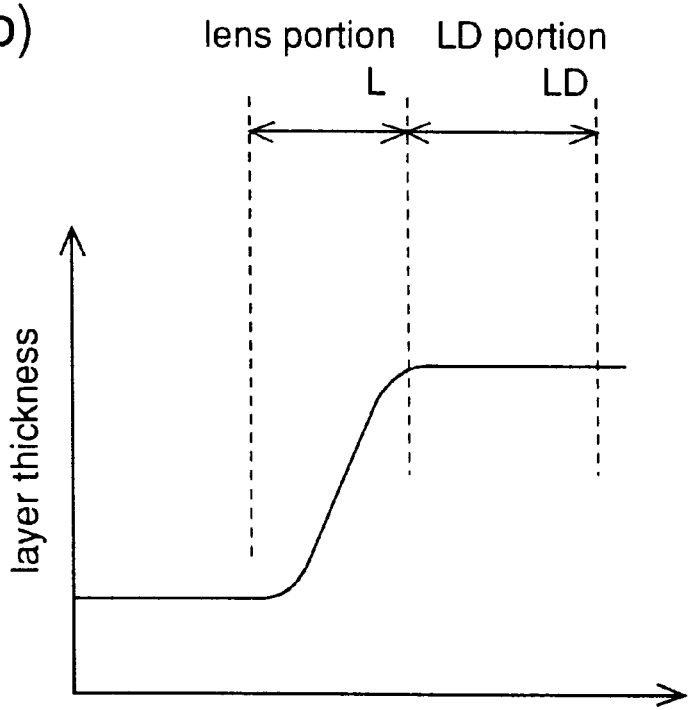

FIG. 8(*a*) is a schematic diagram illustrating a selective growth mask pattern for explaining a fabricating method of an LD with a waveguide lens, according to a fifth embodiment of the present invention. In the figure, reference numeral 1 designates an n-InP substrate, numeral 111 designates a pair of opposing selective masks formed on the n-InP substrate 1 and comprising materials having a property that is easy to occur crystallization as compared with the substrate 1 surface, or having a such surface state. As this selective growth masks, an $SiO_2$ or an $SiN_x$ film that the dangling bonds of the surface are increased due to a damage by ion injection can be used.

The film in this state easily reacts with the material species during crystal growing, and a growth core is formed, whereby the film is made to a state that is easy to occur crystallization as compared with the substrate 1 surface.

This crystallization easily occurs on the mask under the condition in which a growth pressure approaches the atmospheric pressure (760 Torr) or a growth temperature is low (around 400° C.~500° C.).

In the fifth embodiment, the selective growth masks 111 are formed at the portion forming a lens portion L and layers including a waveguide layer are formed by MOCVD, therefore the crystallization easily occurs on the masks 111, so that the growth rate is decreased and the layer thickness is thin in the region 1*a* on the substrate 1 sandwiched by the masks 111 as compared with the region 1*b* where the masks 111 are not formed. In other words, a semiconductor layer grown at the LD portion LD is made to thick because of forming a selective growth mask at the lens portion LD in contrast with the prior art.

Figure 13:
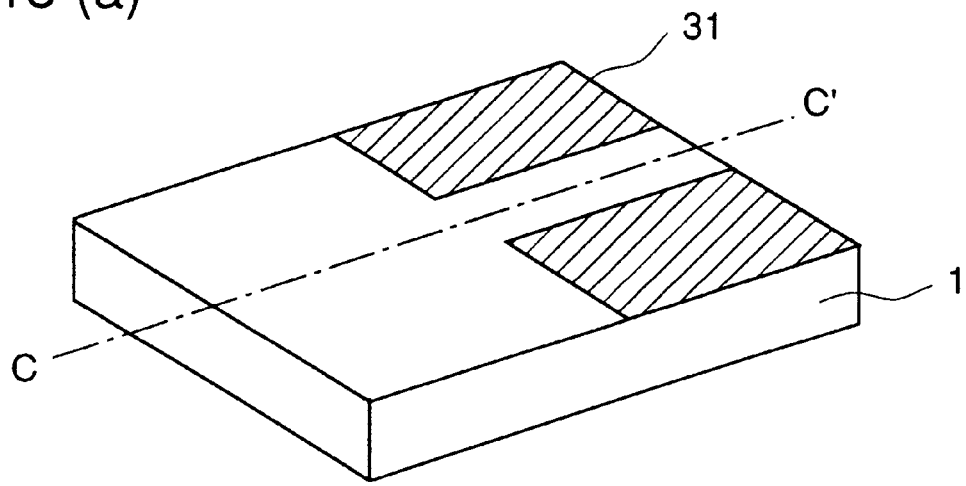
FIGS. 13(a)–13(b) are schematic view and a profile showing a method in which a layer thickness is changed dependent on an effect of a thickness increment by the selective growth according to a prior art.
Figure 13:
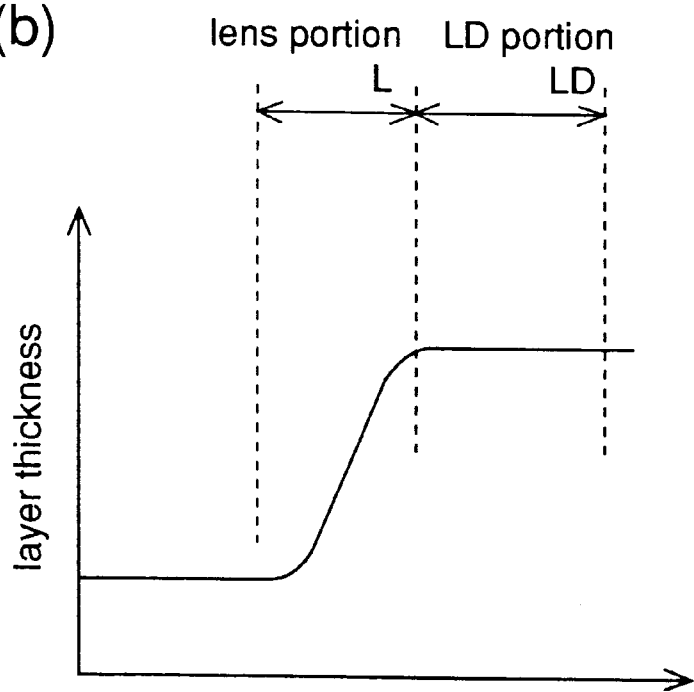
Figure 14:
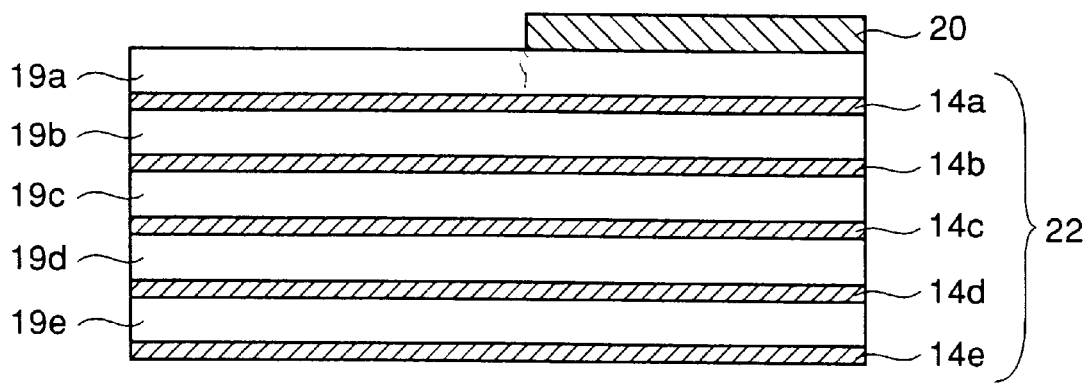
FIGS. 14(a)–14(b) are structural schematic views illustrating a method in which a waveguide thickness at a lens portion is varied in a tapered shape according to a prior art.
Figure 14:
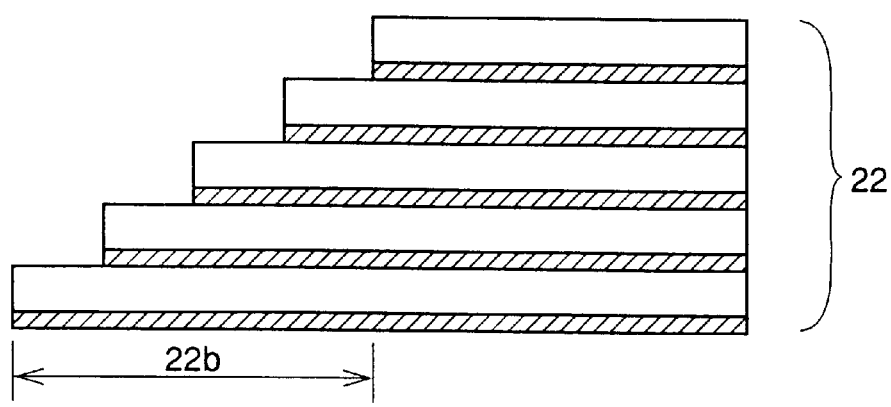
Figure 15:
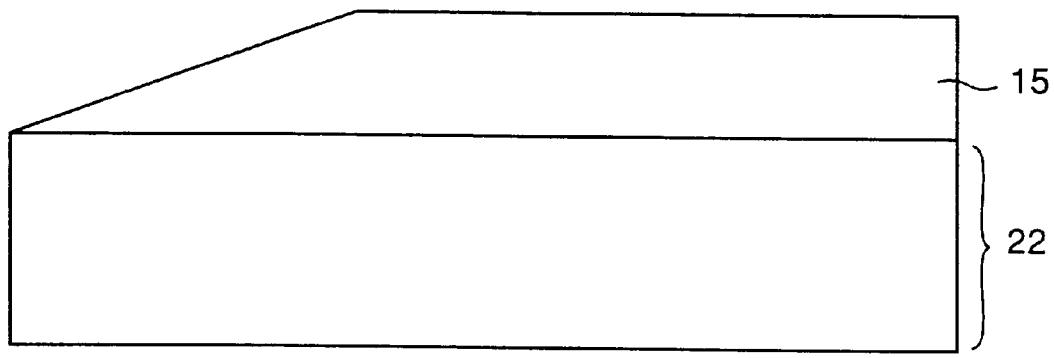
FIGS. 15(a)–15(b) are schematic views illustrating a method in which a waveguide thickness at a lens portion is varied in a tapered shape according to a prior art.
Figure 15:
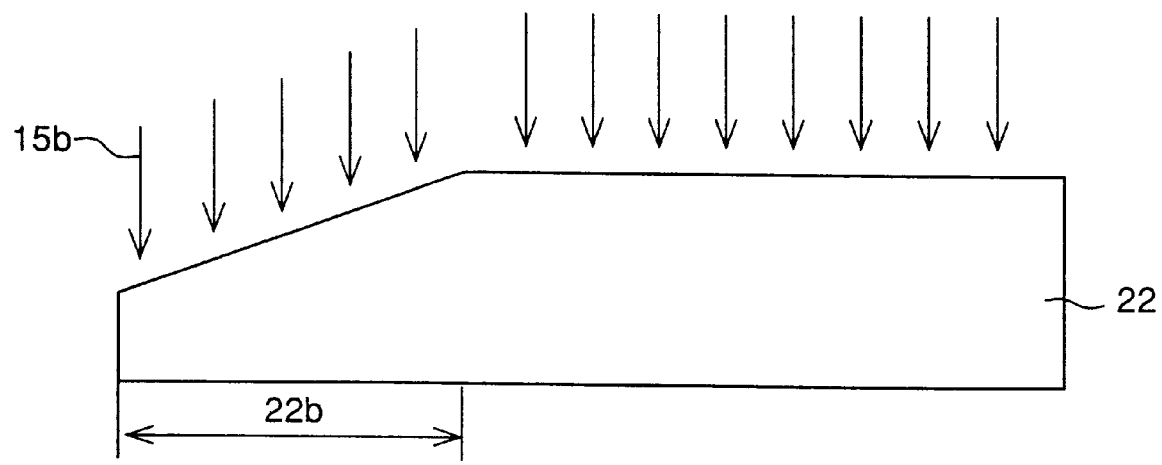

In the prior art shown in FIGS. 13, a semiconductor layer including a laser active layer is performed selective growth using a mask at the LD potion LD, whereby the layer thickness of the semiconductor layer is increased, followed by composition change or deterioration of crystal quality of the semiconductor layer at the LD portion. Since a waveguide at the above-described LD portion LD serves as an active region for oscillation of laser, the deterioration of the crystal quality at the LD portion causes deteriorating the property and a reliability of the LD.

In contrast with the prior art described above, the lens portion L is formed by selective growth in the fifth embodiment. Since this lens portion L serves as an inactive passive waveguide, even though the crystal quality is deteriorated, the property and a reliability of the device do not have a great effect. The crystal quality is not deteriorated in this case because the LD portion which serves as an active region for oscillation of laser is formed in a region without a mask.

Accordingly, the fifth embodiment comprises forming a region comprising the materials having a property that is easy to adhere and to grow the crystal as compared with the above-described substrate, or a region having such a substrate surface state, and forming a semiconductor layer including the waveguide layer such that the layer thickness is controlled to be thin relatively at the portion sandwiched by the above-described regions on the semiconductor substrate. Hence, the thickness of the semiconductor layer and the wavelength are controlled precisely and a reliability of the device is enhanced.

Embodiment 6

Figure 9:
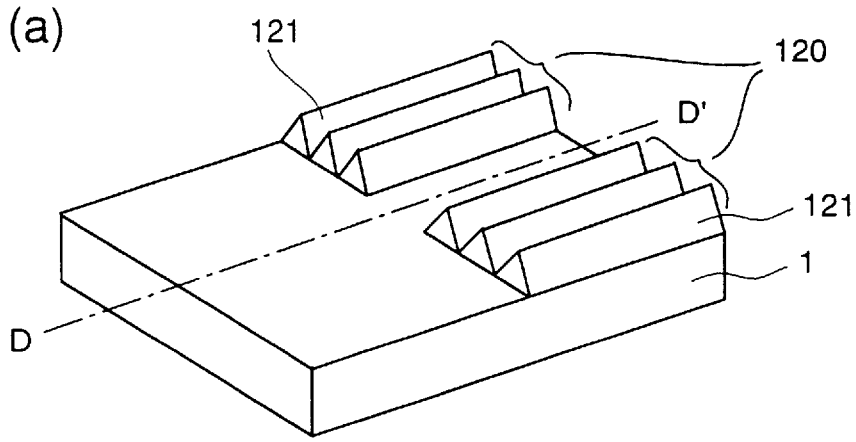
FIG. 9(a) is a schematic view illustrating a fabricating method of an LD with a waveguide lens that the thickness of InGaAs quantum well layer at the lens portion is varied in a tapered shape and 9(b), 9(c), and 9(d) are profiles showing an entire layer thickness, an InGaAs layer thickness, and an InP layer thickness, respectively, using the selective growth according to a sixth embodiment of the present invention.
Figure 9:
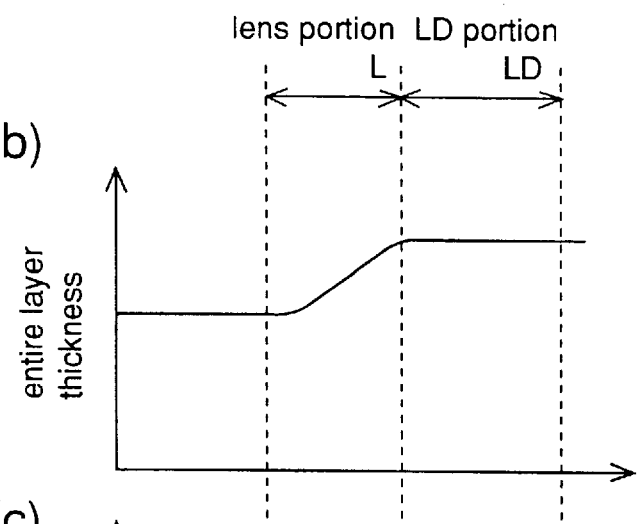
Figure 9:
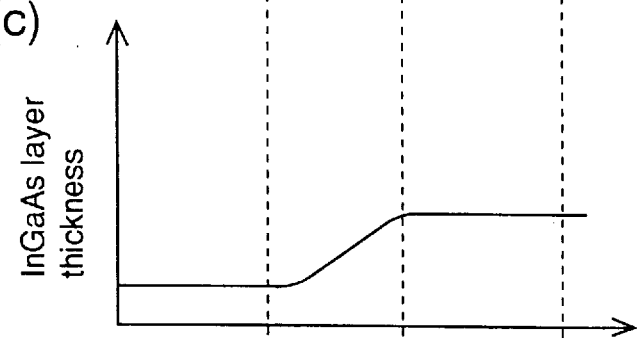
Figure 9:
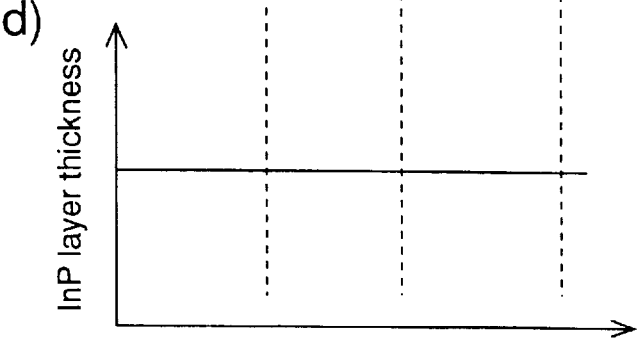

FIG. 9(*a*) is a schematic diagram illustrating a substrate explaining a fabricating method of an LD with a waveguide lens according to a sixth embodiment of the present invention, shows a substrate in which selective growth of semiconductor layers is performed in the fabricating method. In FIG. 9(*a*), reference numeral 1 designates an n-InP substrate, numeral 121 designates stripe shaped semiconductor layers formed along the [011] direction so as to have a triangular cross-section having sidefaces of the (111)B facet, respectively, and the stripe shaped semiconductor layers 121 constitute a pair of layer thickness control regions 120 comprising a pair of groups of three stripe shaped semiconductor layers 121 which are opposite and sandwich the region for forming a stripe portion of the laser active layer. The triangular and stripe shaped semiconductor layers 121 are formed by film formation with patterning using a SiO$_2$ film and performing wet-etching on the substrate 1.

A pattern by the triangular and stripe shaped semiconductors 121 is formed at the portions which sandwiches the portion LD for forming the laser active layer, and layers including a waveguide layer is grown by MOCVD. The construction of the layer is similar to that in the first embodiment. InGaAs (well layer) in the InGaAs/InGaAsP multi quantum well waveguide layer 42 does not practically grow on the (111)B facet of the crystal, whereby the InGaAs/InGaAsP multi quantum well waveguide layer 42 does not grow at the triangular pattern portion 121 of the layer thickness control region 120. The material species are excessively supplied by vapor phase diffusion to the portion sandwiched by the triangular pattern for forming the laser active layer stripe portion using the same principle as the prior art using a mask shown in FIG. 13, whereby the layer thickness is increased in this region.

Accordingly, the InGaAs is thick at LD portion LD as compared with the other region as shown in FIG. 9(*c*), on the other hand, InP grows on the (111)B facet of the crystals shown in FIG. 9(*d*), so that increase of the layer thickness by vapor phase diffusion does not occur, resulting in the even thickness throughout the region as shown in FIG. 9(*d*). The film thickness distribution shown in FIG. 9(*b*) is obtained as the entire film thickness.

A spot size of the light propagating on a waveguide is mainly determined by the thickness of the InGaAs layer for optical confinement, and is not dependent on the thicknesses of the InP cladding layers 3 and 4 which sandwich the InGaAs layer. Thus in order to make the waveguide have a function of lens, the ratio of the thickness of the InGaAs layer at the LD portion LD and at the tip of the lens portion L is made to 5:1. An advantage of increasing the thickness of the InGaAs layer is reduction of the difference in level. Specifying that the waveguide thickness is 0.2 $\mu$m and the thicknesses of the InP cladding layers 3 and 4 are 0.5 $\mu$m, respectively, so that the entire thickness of the semiconductor layer is mostly taken by the thickness of InP. In the method of increasing only the thickness of the InGaAs layer, since there is no difference between the thickness of the InP at the lens portion and at the LD portion, the difference in level at the boundary portion is largely reduced as compared with the prior art shown in FIG. 3.

According to this sixth embodiment, several stripe shaped semiconductor layers having a triangular cross-section with the sidefaces of the (111)B facet along the [011] direction are formed in a pair of layer thickness control regions which are opposite on a semiconductor substrate. A crystal growth is performed on the semiconductor substrate and a semiconductor layer including an optical waveguide layer is grown such that the layer having a determined composition is more thick at the region sandwiched by the layer thickness control regions than the layer thickness at other regions. Therefore the thickness of the semiconductor layer and the wavelength are controlled with accuracy, and a high-accuracy LD with a waveguide lens is obtained. Besides, the method using the selective growth described in the fifth and sixth embodiments is applied not only to an LD with a lens but also to any device fabricated using the selective growth, for example, an LD with a modulator, an optical integrated device and the like.

Figure 10:
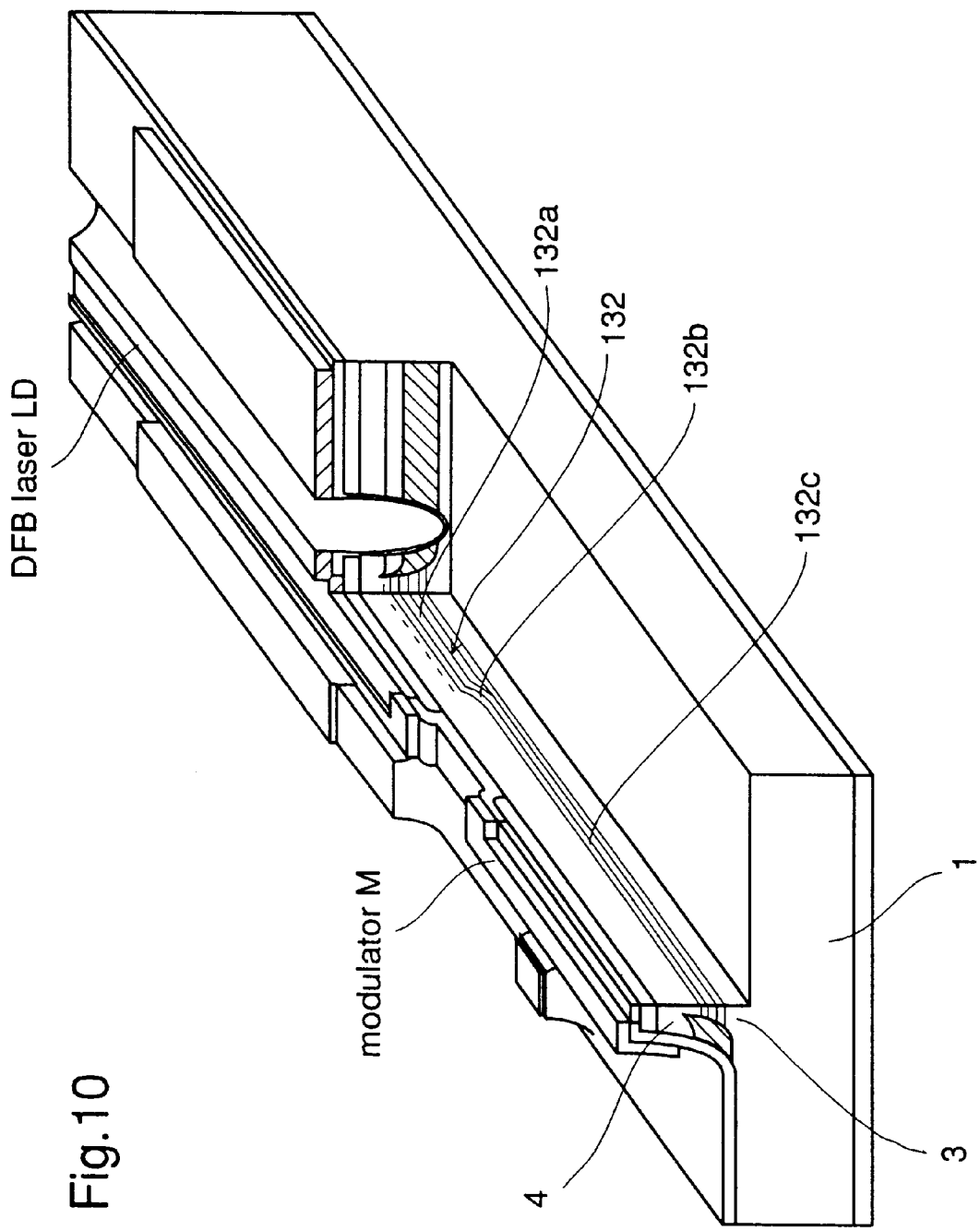
FIG. 10 is a schematic view illustrating an LD with a modulator which is an example of an optical integrated device fabricated in the fifth and the sixth embodiment of the present invention.

In an LD with a modulator, the multi quantum well waveguide layer 132 at the DFB laser LD portion (132*a*) is more thick than that at the modulator M portion (132*c*) and a effective band gap energy value of the waveguide at the modulator M portion (132*c*) is relatively larger than that at the DFB laser LD portion (132*a*), as shown in FIG. 10.

However, the laser beam generated from the DFB laser LD portion is not extinguished at the modulator M portion and emitted from the facet (ON state) when the bias is not impressed to the modulator M, the laser beam is extinguished owing to the QCSE (Quantum Confining Size Effect) of the quantum well layer and in OFF state when the reverse bias is impressed to the modulator M.

The integrated optical device is a monolithically integrated device in which an LD and a PD (photodetector), a switch, a coupler, an optical amplifier, or the like, are connected at the waveguide whose effective band gap energy is controlled by the above-described method.

What is claimed is:

1. A method of fabricating an integrated waveguide device comprising:

forming spaced apart regions comprising a material on a surface of a semiconductor substrate and having a surface state easily adhered to by a growing crystalline layer; and growing a crystalline layer on the regions including a waveguide layer of controlled thickness so that a thickness of the layer sandwiched by the regions is thinner than other parts of the layer.

2. An integrated waveguide device fabricated by a method comprising:

forming spaced apart regions comprising a material on a surface of a semiconductor substrate and having a surface state easily adhered to by a growing crystalline layer; and growing a crystalline layer on the regions including a waveguide layer of controlled thickness so that a thickness of the layer sandwiched by the regions is thinner than other parts of the layer.

3. A method of fabricating an integrated waveguide device comprising:

forming a ridge having a tapered width along the [011] direction of and on a semiconductor substrate; and growing a laminated layer structure including a light waveguide layer on the ridge having a tapered width so that a waveguide lens having a tapered width is formed.

4. An integrated waveguide device fabricated by a method comprising:

forming a ridge having a tapered width along the [011] direction of and on a semiconductor substrate; and growing a laminated layer structure including a light waveguide layer on the ridge having a tapered width so that a waveguide lens having a tapered width is formed.

5. A method of fabricating an integrated waveguide device comprising:

forming a ridge having a tapered width along the [011] direction of and on a semiconductor substrate; and growing a laminated layer structure including a light waveguide layer on the ridge having a tapered width so that a waveguide lens having a tapered width is formed, the light waveguide layer having a triangular cross-section grown on the ridge, the waveguide layer being formed at an apex of the triangular cross-section.

6. An integrated waveguide device fabricated by a method comprising:

forming a ridge having a tapered width along the [011] direction of and on a semiconductor substrate; and growing a laminated layer structure including a light waveguide layer on the ridge having a tapered width so that a waveguide lens having a tapered width is formed, the light waveguide layer having a triangular cross-section grown on the ridge, the waveguide layer being formed at an apex of the triangular cross-section.

7. The integrated waveguide device of claim 4 wherein the integrated waveguide device includes a waveguide lens.

8. The integrated waveguide device of claim 4 wherein the integrated waveguide device is a laser diode with a waveguide lens.

9. The integrated waveguide device of claim 4 wherein the integrated waveguide device is an optical integrated device with a waveguide lens.

10. The integrated waveguide device of claim 6 wherein the integrated waveguide device is a laser diode with a waveguide lens.

11. A method of fabricating an integrated waveguide device comprising:

forming opposing spaced apart thickness control regions respectively having several stripe-shaped semiconductor layers with triangular cross-sections and side surfaces of (111)B planes along the [011] direction of and on a semiconductor substrate; and growing a laminated semiconductor layer structure including a light waveguide layer of controlled thickness on the substrate so that a layer of controlled composition and grown in a region sandwiched by the thickness control regions is thicker there than elsewhere.

12. An integrated waveguide device fabricated by a method comprising:

forming opposing spaced apart thickness control regions respectively having several stripe-shaped semiconductor layers with triangular cross-sections and side surfaces of (111)B planes along the [011] direction of and on a semiconductor substrate; and growing a laminated semiconductor layer structure including a light waveguide layer of controlled thickness on the substrate so that a layer of controlled composition and grown in a region sandwiched by the thickness control regions is thicker there than elsewhere.

13. A method of fabricating an integrated waveguide device comprising:

forming a selective growth mask in a stripe shape along the [011] direction of and on a semiconductor substrate, the mask having two spaced apart parts defining therebetween an aperture having a tapered width, each of the parts having a width varying in a manner similar to the tapered width of the aperture along the [011] direction so that the crystalline growth on the semiconductor substrate within the aperture is uniform along the length of the parts; and growing a laminated crystalline layer structure on the semiconductor substrate in the aperture of the selective growth mask and including a waveguide layer, forming, at the tapered width, a tapered light waveguide as a waveguide lens.

14. The integrated waveguide device of claim 13 wherein the integrated waveguide device includes a waveguide lens.

15. The integrated waveguide device of claim 13 wherein the integrated waveguide device is a laser diode with a waveguide lens.

16. The integrated waveguide device of claim 13 wherein the integrated waveguide device is an optical integrated device with a waveguide lens.

17. An integrating waveguide device fabricated by a method comprising:

forming a selective growth mask in a stripe shape along the [011] direction of and on a semiconductor substrate, the mask having two spaced apart parts defining therebetween an aperture having a tapered width, each of the parts having a width varying in a similar manner so that the width of the aperture varies along the [011] direction and the crystalline growth rate on the semiconductor substrate within the aperture is uniform along the length of the parts; and growing a laminated crystalline layer structure on the semiconductor substrate in the aperture of the selective growth mask and including a waveguide layer, forming at the tapered width, a tapered light waveguide as a waveguide lens.

18. A method of fabricating and integrated waveguide device comprising:

forming a selective growth mask in a stripe shape along the [011] direction of and on a semiconductor substrate, the mask having two spaced apart parts defining therebetween an aperture having a tapered width, each of the parts having a width varying in a manner similar to the tapered width of the aperture along the [011] direction so that the crystalline growth rate on the semiconductor substrate within the aperture is uniform along the length of the parts; and growing a laminated crystalline layer structure on the semiconductor substrate in the aperture of the selective growth mask and including a waveguide layer, the waveguide layer having a triangular cross-section as grown and located at an apex of the triangular cross-section.

19. An integrated waveguide device fabricated by a method comprising:

forming a selective growth mask in a stripe shape along the [011] direction of and on a semiconductor substrate, the mask having two spaced apart parts defining therebetween an aperture having a tapered width, each of the parts having a width varying in a manner similar to the tapered width of the aperture along the [011] direction so that the crystalline growth rate on the semiconductor substrate within the aperture is uniform along the length of the parts; and growing a laminated crystalline layer structure on the semiconductor substrate in the aperture of the selective growth mask and including a waveguide layer, the waveguide having a triangular cross-section as grown and located at an apex of the triangular cross-section.

20. The integrated waveguide device of claim 19 wherein the integrated waveguide device is a laser diode with a waveguide lens.

21. The method of claim 13 wherein as the width of the aperture becomes smaller along the [011] direction, the widths of each of the parts of the mask-becomes smaller.

22. The integrated waveguide device of claim 17 wherein as the width of the aperture becomes smaller along the [011] direction, the widths of each of the parts of the mask becomes smaller.

23. The method of claim 18 wherein as the width of the aperture becomes smaller along the [011] direction, the widths of each of the parts of the mask becomes smaller.

24. The integrated waveguide device of claim 19 wherein as the width of the aperture becomes smaller along the [011] direction, the widths of each of the parts of the mask becomes smaller.

* * * * *